United States Patent [19]

Horner et al.

[11] Patent Number: 6,121,783
[45] Date of Patent: Sep. 19, 2000

[54] METHOD AND APPARATUS FOR ESTABLISHING ELECTRICAL CONTACT BETWEEN A WAFER AND A CHUCK

[76] Inventors: Gregory S. Horner, 3717 Carlysle Ave., Santa Clara, Calif. 95051; Meindert J. Kleefstra, 34303 Bramble La., Solon, Ohio 44139; Roger L. Verkuil, 37 Sherwood Hts., Wappinger Falls, N.Y. 12590; Robert A. Miles, 10086 Hideaway Cove, Aurora, Ohio 44202

[21] Appl. No.: 08/839,217

[22] Filed: Apr. 22, 1997

[51] Int. Cl.[7] .................................................... G01R 31/02

[52] U.S. Cl. ........................................... 324/757; 324/765

[58] Field of Search ................................... 327/754, 756, 327/765, 757

[56] References Cited

U.S. PATENT DOCUMENTS 5,285,151   2/1994   Akamel et al. .......................... 324/765
5,498,974   3/1996   Verkuil et al. .

*Primary Examiner*—Walter E. Snow
*Attorney, Agent, or Firm*—Pearne, Gordon, McCoy & Granger LLP

[57] ABSTRACT

A needle is pressed into the backside oxide of a semiconductor wafer and a voltage applied to the wafer greater than the breakdown voltage of the oxide in order to make an electrical contact with the bulk material of the wafer. A capacitor plate is provided proximate to a wafer on a chuck and a Kelvin probe is provided proximate to the wafer. A varying voltage is applied between the chuck and the capacitor plate and a voltage is monitored between the Kelvin probe and the chuck. The monitored voltage remaining constant indicates electrical contact between the chuck and the wafer.

14 Claims, 1 Drawing Sheet

METHOD AND APPARATUS FOR ESTABLISHING ELECTRICAL CONTACT BETWEEN A WAFER AND A CHUCK

BACKGROUND OF THE INVENTION

The present invention relates to the testing of semiconductor wafers and, in particular, to establishing electrical connection between the wafer and a wafer chuck.

Semiconductor wafers are often tested both individually and to monitor process conditions. During testing the wafers are typically held by an electrically conductive vacuum chuck. Because the wafers usually have a backside oxide layer, it is usual to scratch through the oxide with a pointed electrode to insure that the bulk semiconductor material within the wafer is electrically connected to the chuck (i.e., an ohmic connection). It is often difficult to both successfully make this connection and to determine if indeed it was successful.

U.S. Pat. No. 5,498,974 shows the use of a Kelvin probe to make measurements on a semiconductor wafer mounted on a vacuum chuck and is incorporated herein by reference.

SUMMARY OF THE INVENTION

The invention includes a method for making electrical contact between a semiconductor wafer having a dielectric layer and a wafer chuck holding the wafer. A pointed contact is urged against the dielectric layer. A voltage equal or greater than the dielectric layer breakdown voltage is momentarily applied between the contact and the chuck.

The invention also includes a method for determining electrical contact between the semiconductor wafer and the wafer chuck. A capacitor plate is provided proximate to the wafer. A Kelvin probe is provided proximate to the wafer. A varying voltage is applied between the chuck and the capacitor plate. A voltage is monitored between the Kelvin probe and the chuck. The monitored voltage remaining constant is indicative of electrical contact.

The invention also includes an apparatus for making electrical contact between a semiconductor wafer having a dielectric layer and a wafer chuck holding the wafer. The apparatus includes a pointed contact, a contact actuator for urging the contact against the dielectric layer, and a voltage source for momentarily applying a voltage equal or greater than the dielectric layer breakdown voltage between the contact and the chuck.

The invention also includes an apparatus for determining electrical contact between a semiconductor wafer and a wafer chuck. The apparatus includes a Kelvin probe proximate to the wafer, a capacitor plate proximate to the wafer, a variable voltage source between the chuck and the capacitor plate, and a voltage monitor between the Kelvin probe the chuck. The monitored voltage remaining constant is indicative of electrical contact.

DESCRIPTION OF THE PREFERRED EMBODIMENTS

Figure 1:
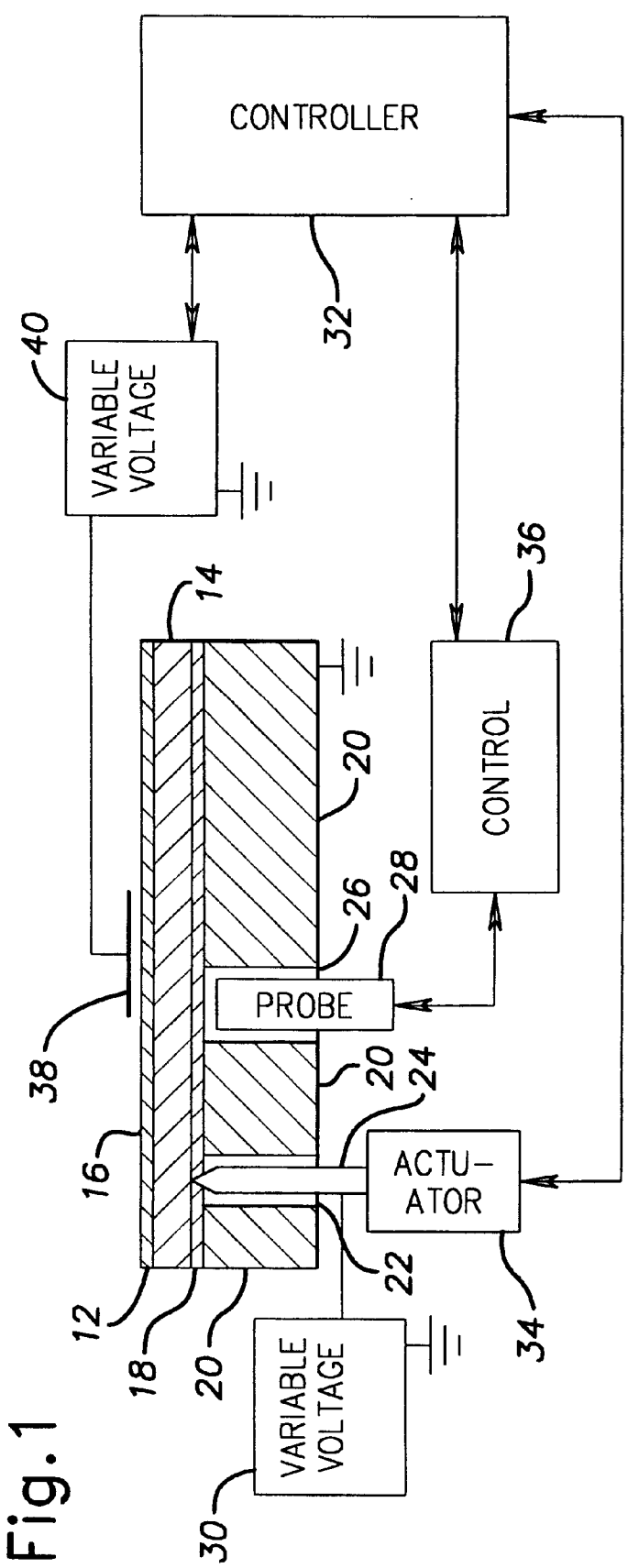
FIG. 1 is a combination schematic and block diagram of an apparatus according to the invention. The wafer 12 and chuck 20 are shown in cross section with exaggerated vertical scale.

Referring to FIG. 1, a semiconductor wafer 12 includes a bulk portion 14 and dielectric layers 16, 18. The layers 16, 18 may be, for example, silicon dioxide.

The wafer 12 is held by a wafer chuck 20. The chuck 20 is electrically conductive and may, for example, hold the wafer 12 by means of small unshown vacuum ports in the surface of the chuck 20.

The chuck 20 is provided with an aperture 22 for a pointed contact 24. The pointed contact 24 may be, for example, a tungsten carbide needle about 0.05 inches in diameter tapering to a point. The chuck 20 is also provided with an aperture 26 for a Kelvin probe 28. The Kelvin probe 28 may be, for example, 0.25 inches in diameter and be spaced 0.02 inches from the wafer 12.

A voltage supply 30 is connected to the pointed contact 24. The voltage supply 30 is controlled by a controller 32. The controller 32 may be, for example, a microprocessor or a general purpose computer.

The pointed contact 24 is mounted on a contact actuator 34 controlled by the controller 32. The actuator 34 may be, for example, a solenoid that moves the contact 24 against the wafer 12 when actuated. The actuator 34 could also be, for example, vacuum operated or operated by any other mechanical or electrical method.

As is known in the art, the Kelvin probe 28 is connected to a Kelvin probe controller 36. The Kelvin probe controller vibrates the Kelvin probe 28 in a vertical direction and provides a signal indicative of the electric potential of the wafer 12 to the controller 32.

A capacitor plate 38 is provided above the wafer 12. The capacitor plate 38 may be, for example, 0.25 inches in diameter and spaced 10 microns from the wafer 12. The capacitor plate 38 is connected to a voltage supply 40 which is controlled by the controller 32. The voltage supplies 30, 40 also may be, for example, the same voltage supply with the controller 32 controlling not only the voltage, but the device to which the voltage is applied by control of unshown switches.

To establish an electrical connection between the bulk portion 14 and the pointed contact 24, the actuator 34 presses or urges the pointed contact 24 against the dielectric layer 18. The voltage supply 30 is then ramped to a voltage maximum above the breakdown voltage of the dielectric layer 18 and then returned to ground. This breakdown voltage may be, for example, about 120 volts for a 1,000 angstroms thick oxide. The voltage ramp may, for example, take place in less than a millisecond.

The combination of the pressure on the pointed contact 24 and the voltage ramp produces an ohmic (i.e., characterized by a bidirectional resistance) electrical connection between the bulk portion 14 of the semiconductor wafer 12 and the pointed contact 24. The pointed contact 24 is then connected to the potential of the chuck 20. The force on the pointed contact may be, for example, 10 to 50 grams, and typically about 25 grams.

As an alternate embodiment, the voltage maximum may be applied to the pointed contact 24 prior to contact with the wafer 12 and ramped down after contact.

To determine if there is an electrical connection between the chuck 20 and the bulk portion 14, a step voltage (e.g., 100 volts with a microsecond rise time) or other suitable time function is applied between the capacitor plate 38 and the chuck 20 by the voltage supply 40.

Contemporaneously, the Kelvin probe 28 measures the electrical potential of the wafer 12 with respect to the chuck 20. If this monitored voltage is constant, there is an electrical contact between the wafer 12 and the chuck 20.

If the voltage source 40 is varied over both positive and negative values and the monitored voltage is constant for both negative and positive going voltages, the connection is ohmic (i.e., no diode-like effects).

In the case of no connection (or a reverse-biased p-n junction connection), the current flow between the wafer 12 and the chuck 20 is essentially capacitive. In this case, the Kelvin probe 28 indicates the potential of the wafer 12 with respect to the chuck varies according to the effective wafer to chuck capacitance and wafer to chuck leakage.

It should be noted that the positions of the Kelvin probe 28 and the capacitor plate 38 can also be both above the wafer 12, both below (a suitable aperture in the chuck 20 would be required), or interchanged between the positions shown in FIG. 1.

The use of the Kelvin probe 28 in the determination of chuck contact advantageously makes use of a sensor that may already be present in a wafer testing tool. However, it is possible to use an additional capacitor plate in place of the Kelvin probe to sense the voltage transients associated with non-ohmic contact. In this embodiment, the controller 32 responds to the voltage on the substituted capacitor plate directly, instead of the signal from the Kelvin probe control 36. The second capacitor plate may be, for example, 0.25 inches in diameter also.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A method for making electrical contact between a semiconductor wafer having a dielectric layer and a wafer chuck holding said wafer, said dielectric layer having a breakdown voltage, said method comprising:

urging a pointed contact against said dielectric layer; and momentarily applying a voltage equal or greater than said breakdown voltage between said contact and said chuck, thereby creating an ohmic connection between said wafer and said chuck.

2. A method according to claim 1, wherein said voltage is applied after said pointed contact contacts said dielectric layer.

3. A method according to claim 1, wherein said voltage is applied to said pointed contact prior to said pointed contact contacting said dielectric layer and reduced thereafter.

4. A method for determining electrical contact between a semiconductor wafer and a wafer chuck, said method comprising:

providing a capacitor plate proximate to said wafer;

providing a Kelvin probe proximate to said wafer;

applying a varying voltage between said chuck and said capacitor plate; and monitoring a voltage between said Kelvin probe and said chuck, wherein said monitored voltage remaining constant is indicative of electrical contact.

5. A method according to claim 4, wherein said varying voltage is varied over both positive and negative values to indicate if said electrical contact is ohmic.

6. A method for determining electrical contact between a semiconductor wafer and a wafer chuck, said method comprising:

providing a first capacitor plate proximate to said wafer;

providing a second capacitor plate proximate to said wafer;

applying a varying voltage between said chuck and said first capacitor plate; and monitoring a voltage between said second capacitor plate and said chuck, wherein said monitored voltage remaining constant is indicative of electrical contact.

7. A method according to claim 6, wherein said varying voltage is varied over both positive and negative values to indicate if said electrical contact is ohmic.

8. An apparatus for making electrical contact between a semiconductor wafer having a dielectric layer and a wafer chuck holding said wafer, said dielectric layer having a breakdown voltage, said apparatus comprising:

a pointed contact;

a contact actuator for urging said contact against said dielectric layer; and a voltage source for momentarily applying a voltage equal or greater than said breakdown voltage between said contact and said chuck, thereby creating an ohmic connection between said wafer and said chuck.

9. An apparatus according to claim 8, wherein said voltage is applied after said pointed contact contacts said dielectric layer.

10. An apparatus according to claim 8, wherein said voltage is applied to said pointed contact prior to said pointed contact contacting said dielectric layer and reduced thereafter.

11. An apparatus for determining electrical contact between a semiconductor wafer and a wafer chuck, said apparatus comprising:

a Kelvin probe proximate to said wafer;

a capacitor plate proximate to said wafer;

a variable voltage source between said chuck and said capacitor plate; and a voltage monitor between said Kelvin probe and said chuck, wherein a monitored voltage remaining constant is indicative of electrical contact.

12. An apparatus according to claim 11, wherein said variable voltage is varied over both positive and negative values to indicate if said electrical contact is ohmic.

13. An apparatus for determining electrical contact between a semiconductor wafer and a wafer chuck, said apparatus comprising:

a first capacitor plate proximate to said wafer;

a second capacitor plate proximate to said wafer;

a variable voltage source between said chuck and said first capacitor plate; and a voltage monitor between said second capacitor plate and said chuck, wherein a monitored voltage remaining constant is indicative of electrical contact.

14. An apparatus according to claim 13, wherein said variable voltage is varied over both positive and negative values to indicate if said electrical contact is ohmic.

* * * * *